United States Patent
Lu et al.

(10) Patent No.: US 9,825,088 B2
(45) Date of Patent: Nov. 21, 2017

(54) LIGHT-EMITTING DEVICE AND MANUFACTURING METHOD THEREOF

(71) Applicant: EPISTAR CORPORATION, Hsinchu (TW)

(72) Inventors: Shao-Ping Lu, Hsinchu (TW); Yi-Ming Chen, Hsinchu (TW); Yu-Ren Peng, Hsinchu (TW); Chun-Yu Lin, Hsinchu (TW); Chun-Fu Tsai, Hsinchu (TW); Tzu-Chieh Hsu, Hsinchu (TW)

(73) Assignee: EPISTAR CORPORATION, Hsinchu (TW)

( * ) Notice: Subject to any disclaimer, the term of this patent is extended or adjusted under 35 U.S.C. 154(b) by 7 days.

(21) Appl. No.: 14/808,295

(22) Filed: Jul. 24, 2015

(65) Prior Publication Data
US 2017/0025567 A1   Jan. 26, 2017

(51) Int. Cl.
*H01L 29/06* (2006.01)
*H01L 31/00* (2006.01)
*H01L 27/15* (2006.01)
*H01L 33/00* (2010.01)
*H01L 33/08* (2010.01)

(52) U.S. Cl.
CPC .......... *H01L 27/153* (2013.01); *H01L 33/005* (2013.01); *H01L 33/08* (2013.01)

(58) Field of Classification Search
CPC . H01L 33/06; H01L 33/0025; H01L 33/0062; H01L 33/10; H01L 2933/0025; H01L 2933/0016
See application file for complete search history.

(56) References Cited

U.S. PATENT DOCUMENTS

| | | | | |
|---|---|---|---|---|
| 5,999,553 A * | 12/1999 | Sun | ...................... | H01S 5/4043 372/23 |
| 8,102,890 B2 * | 1/2012 | Masui | ................... | H01S 5/1833 372/45.01 |
| 2009/0078955 A1 * | 3/2009 | Fan | ......................... | H01L 27/15 257/98 |
| 2011/0026108 A1 * | 2/2011 | Takahashi | .............. | B82Y 20/00 359/344 |
| 2011/0140132 A1 * | 6/2011 | Kang | .................. | H01L 25/0756 257/88 |

* cited by examiner

*Primary Examiner* — Thanh Y Tran
(74) *Attorney, Agent, or Firm* — Ditthavong & Steiner, P.C.

(57) ABSTRACT

A light-emitting device comprises a carrier; and a first semiconductor element comprising a first semiconductor structure and a second semiconductor structure, wherein the second semiconductor structure is closer to the carrier than the first semiconductor structure is to the carrier, the first semiconductor structure comprises a first MQW structure configured to emit a first light having a first dominant wavelength during normal operation, and the second semiconductor structure comprises a second MQW structure configured not to emit light during normal operation.

23 Claims, 5 Drawing Sheets

1

LIGHT-EMITTING DEVICE AND MANUFACTURING METHOD THEREOF

TECHNICAL FIELD

The disclosure relates to a light-emitting device, and more particularly, to a light-emitting device emitting multiple dominant wavelengths.

DESCRIPTION OF BACKGROUND ART

Light-emitting diode (LED) is widely used as a solid-state lighting source. Light-emitting diode (LED) generally comprises a p-type semiconductor layer, an n-type semiconductor layer, and an active layer between the p-type semiconductor layer and the n-type semiconductor layer for emitting light. The principle of LED is to transform electrical energy to optical energy by applying electrical current to LED and injecting electrons and holes to the active layer. The combination of electrons and holes in the active layer emits light accordingly.

SUMMARY OF THE DISCLOSURE

A light-emitting device comprises a carrier; and a first semiconductor element comprising a first semiconductor structure and a second semiconductor structure, wherein the second semiconductor structure is closer to the carrier than the first semiconductor structure is to the carrier, the first semiconductor structure comprises a first MQW structure configured to emit a first light having a first dominant wavelength during normal operation, and the second semiconductor structure comprises a second MQW structure configured not to emit light during normal operation.

DETAILED DESCRIPTION OF THE PRESENT DISCLOSURE

Figure 1A:
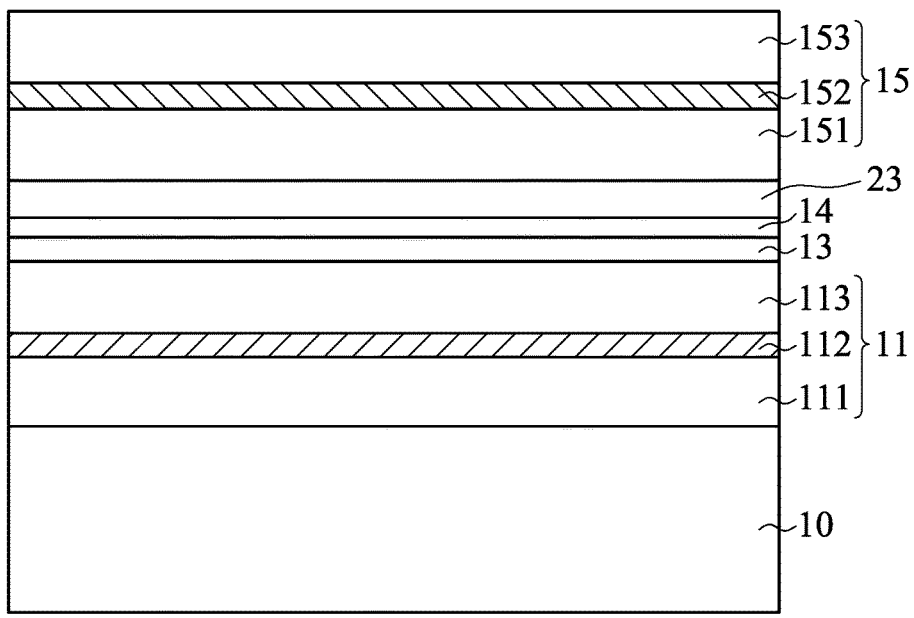
FIGS. 1A-1D show a process flow of a manufacturing method of a light-emitting device in accordance with an embodiment of the present disclosure.

FIGS. 1A-1D show a process flow of a method of manufacturing a light-emitting device 1 in accordance with an embodiment of the present disclosure. As shown in FIG. 1A, the method of manufacturing the light-emitting device 1 comprises a step of epitaxially grown a first semiconductor stack 11 on a growth substrate 10 by epitaxy method, such as metallic-organic chemical vapor deposition (MOCVD) method, molecular beam epitaxy (MBE) method, or hydride vapor phase epitaxy (HVPE) method. The growth substrate 10 comprises a single-crystal material having a single-crystal plane on which the first semiconductor stack 11 can be epitaxially grown, wherein the single-crystal plane comprises sapphire C-plane, sapphire R-plane, or sapphire A-plane. In another example, the growth substrate 10 comprises metal oxide or a semiconductor material such as silicon carbide (SiC), silicon, ZnO, GaAs, or GaN. The first semiconductor stack 11 comprises a first semiconductor layer 111 having a first conductivity-type, a second semiconductor layer 113 having a second conductivity-type different from the first conductivity-type, and a first active layer 112 formed between the first semiconductor layer 111 and the second semiconductor layer 113. The first active layer 112 comprises a single heterostructure (SH), a double heterostructure (DH), or a multi-quantum well (MQW) structure. In one embodiment, the first semiconductor layer 111 is an n-type semiconductor layer for providing electrons, the second semiconductor layer 113 is a p-type semiconductor layer for providing holes, and holes and electrons combine in the first active layer 112 to emit light under a driving current. Alternatively, the first semiconductor layer 111 can be a p-type semiconductor layer, and the second semiconductor layer 113 can be an n-type semiconductor layer. The material of the first active layer 112 comprises $In_xGa_yAl_{(1-x-y)}N$ for emitting light having a dominant wavelength in the ultraviolet to green spectral regions, $In_xGa_yAl_{(1-x-y)}P$ for emitting light having a dominant wavelength in the yellow to red spectral regions, or $In_xGa_yAl_{(1-x-y)}As$ for emitting light having a dominant wavelength in the infrared spectral region.

Next, the method comprises a step of epitaxially growing a reflective layer 13 on the first semiconductor stack 11. The reflective layer 13 comprises a DBR structure and group III-V semiconductor material. The reflective layer 13 comprises a conductivity-type same as that of the second semiconductor layer 113 of the first semiconductor stack 11. Next, a tunnel junction 14 comprising group III-V semiconductor material is epitaxially grown on the first semiconductor stack 11. The tunnel junction 14 comprises a p-n junction formed by a first heavily-doped layer of a first conductivity-type, for example an n-type conductive semiconductor layer, and a second heavily-doped layer of a second conductivity-type, for example a p-type semiconductor layer. The heavily-doped n-type conductive semiconductor layer and the heavily-doped p-type layer have a doping concentration at least one order higher than that of the semiconductor layer of the first semiconductor stack 11. These heavily-doped layers of the tunnel junction 14 are preferable doped with a doping concentration greater than $10^{18}/cm^3$, thus providing a low electrical junction resistance during operation. The tunnel junction 14 having low resistance is provided to be an electrical junction between the first semiconductor structure 11a and another semiconductor structure deposited thereon in the following process. A side of the tunnel junction 14, which is adjacent to the second semiconductor layer 113 or the reflective layer 13, comprises a conductivity-type same as that of the second semiconductor layer 113 or the reflective layer 13. An opposite side of the tunnel junction 14, which is away from the second semiconductor layer 113 or the reflective layer 13, comprises a conductivity-type opposite to that of the second semiconductor layer 113 or the reflective layer 13.

Then, an etching stop layer 23 is epitaxially grown on the first semiconductor stack 11. Next, a second semiconductor stack 15 is epitaxially grown on the etching stop layer 23 by epitaxy method, such as metallic-organic chemical vapor deposition (MOCVD) method, molecular beam epitaxy (MBE) method, or hydride vapor phase epitaxy (HVPE) method. The second semiconductor stack 15 comprises a third semiconductor layer 151 having a first conductivity-type, a fourth semiconductor layer 153 having a second-conductivity type different from the first conductivity-type, and an second active layer 152 formed between the third semiconductor layer 151 and the fourth semiconductor layer 153. The second active layer 152 comprises a single heterostructure (SH), a double heterostructure (DH), or a multi-quantum well (MQW) structure. In one embodiment, the third semiconductor layer 151 is an n-type semiconductor layer for providing electrons, the fourth semiconductor layer 153 is a p-type semiconductor layer for providing holes, and holes and electrons combine in the second active layer 152 to emit light under a driving current. Alternatively, the third semiconductor layer 151 can be a p-type semiconductor layer, and the fourth semiconductor layer 153 can be an n-type semiconductor layer. The material of the second active layer 152 comprises $In_xGa_yAl_{(1-x-y)}N$ for emitting light having a dominant wavelength in the ultraviolet to green spectral regions, $In_xGa_yAl_{(1-x-y)}P$ for emitting light having a dominant wavelength in the yellow to red spectral regions, or $In_xGa_yAl_{(1-x-y)}As$ for emitting light having a dominant wavelength in the infrared spectral region.

The first semiconductor stack 11, the reflective layer 13, the tunnel junction 14, the etching stop layer 23, and the second semiconductor stack 15 are deposited on the growth substrate continuously in an epitaxy chamber to prevent from being contaminated and to ensure a high quality of the semiconductor layers that staked.

Figure 1B:
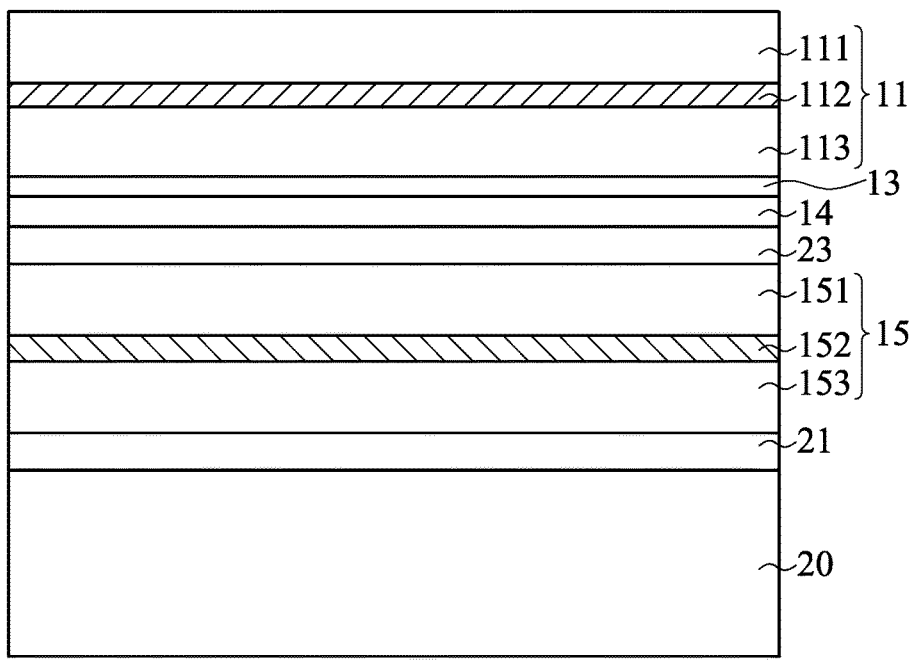

As shown in FIG. 1B, the method of manufacturing the light-emitting device 1 further comprises a bonding step of flipped mounting the multi-layered structure formed by the above steps to a carrier 20 by bonding the fourth semiconductor layer 153 of the second semiconductor stack 15 to the carrier 20 through an adhesive layer 21 and a thermally pressing process, wherein the carrier 20 comprises a first region and a second region next to the first region. The bonding layer is made of an adhesive material. A material of the carrier 20 and the adhesive layer 21 comprises conductive material, such as metal or solder. In a variant of the embodiment, the carrier 20 comprises a thermal conductive material or an insulated material. Next, the growth substrate 10 is removed after the fourth semiconductor layer 153 of the second semiconductor stack 15 is bonded to the carrier 20.

Figure 1C:
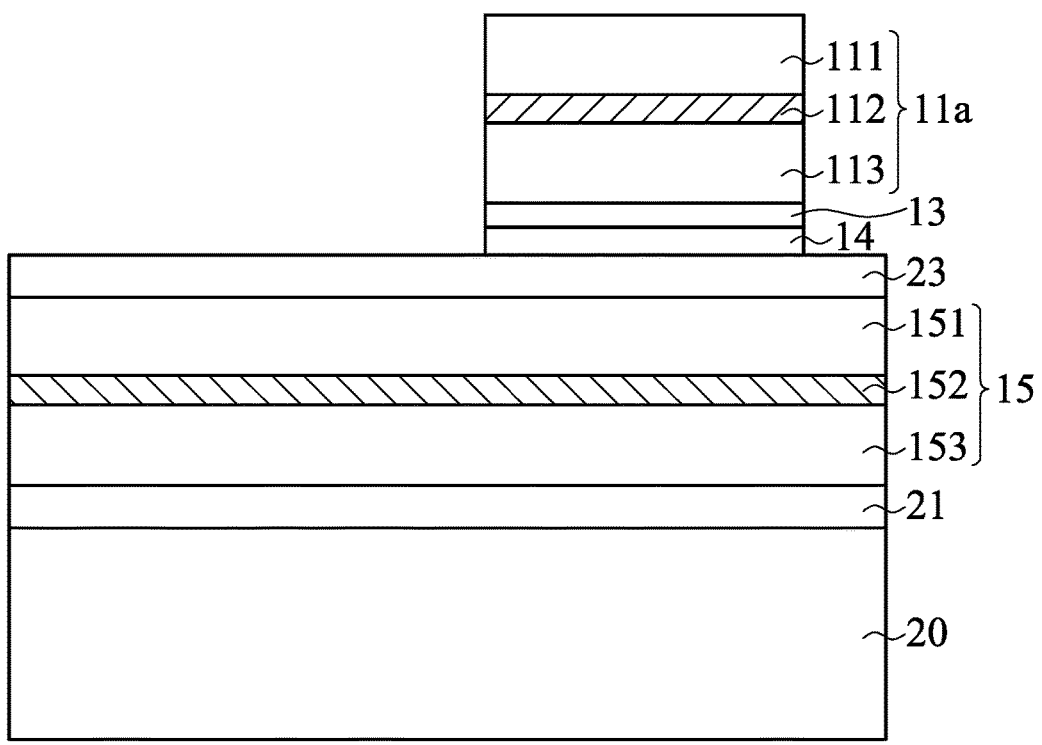

As shown in FIG. 1C, the method of manufacturing the light-emitting device 1 further comprises forming a patterned mask (not shown) on the first semiconductor stack 11 by a photolithographic process and etching the first semiconductor stack 11 over the second region of the carrier, such as a portion of the first semiconductor stack 11, the reflective layer 13, and the tunnel junction 14 not covered by the patterned mask by chemical wet etching or dry etching to expose the etching stop layer 23 while retaining the first semiconductor stack 11 over the first region of the carrier 20. The etching stop layer 23 is formed of a group III-V material, such as InGaP, having a relative lower etching rate than the first semiconductor stack 11 in the etching step. The portion of the first semiconductor stack 11 covered by the patterned mask is remained on the second semiconductor stack 15 to form a first semiconductor structure 11a.

Figure 1D:
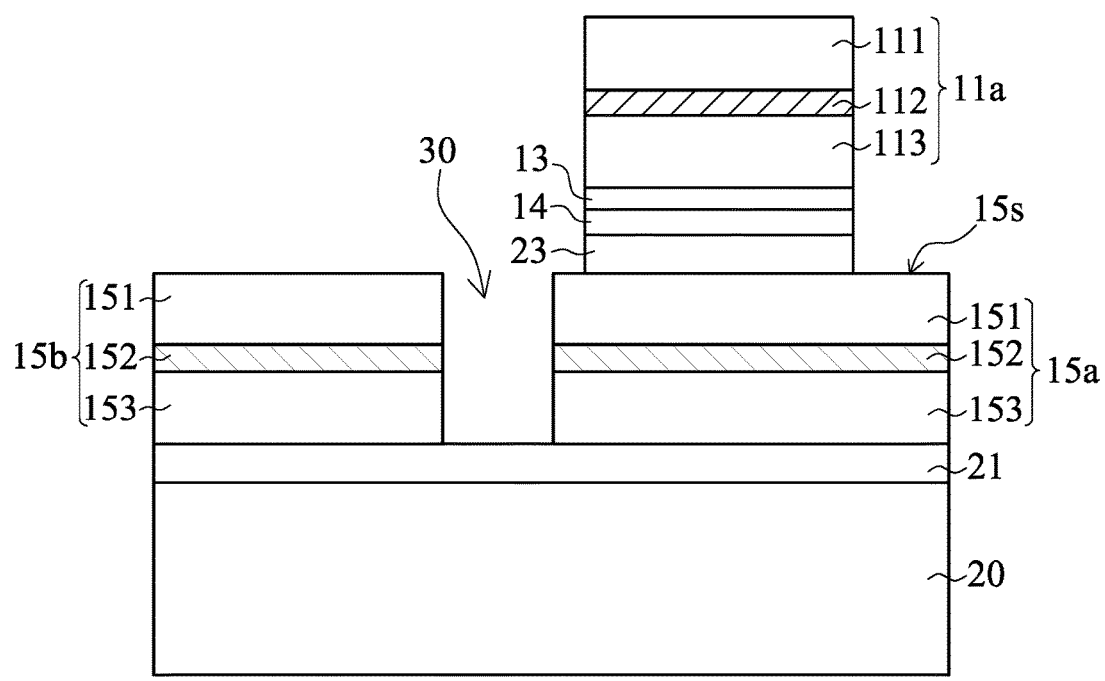

As shown in FIG. 1D, the method of manufacturing the light-emitting device 1 further comprises forming a groove 30 through the exposed etching stop layer 23 and the second semiconductor stack 15. The groove 30 divides the second semiconductor stack 15 into a second semiconductor structure 15a and a third semiconductor structure 15b, wherein the second semiconductor structure 15a is formed between the carrier 20 and the first semiconductor structure 11a, and the third semiconductor structure 15b is formed above the carrier 20 and spaced apart from the second semiconductor structure 15a.

Figure 2:
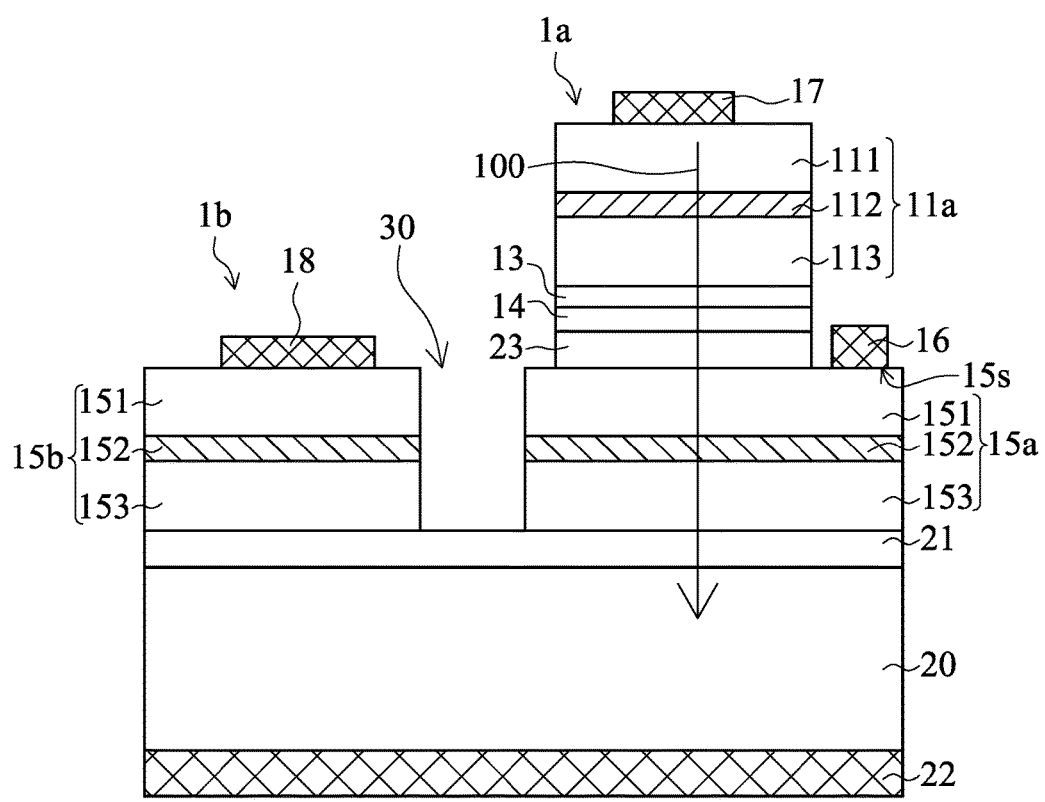
FIG. 2 shows a sectional view of a light-emitting device in accordance with a first embodiment of the present disclosure.
Figure 3:
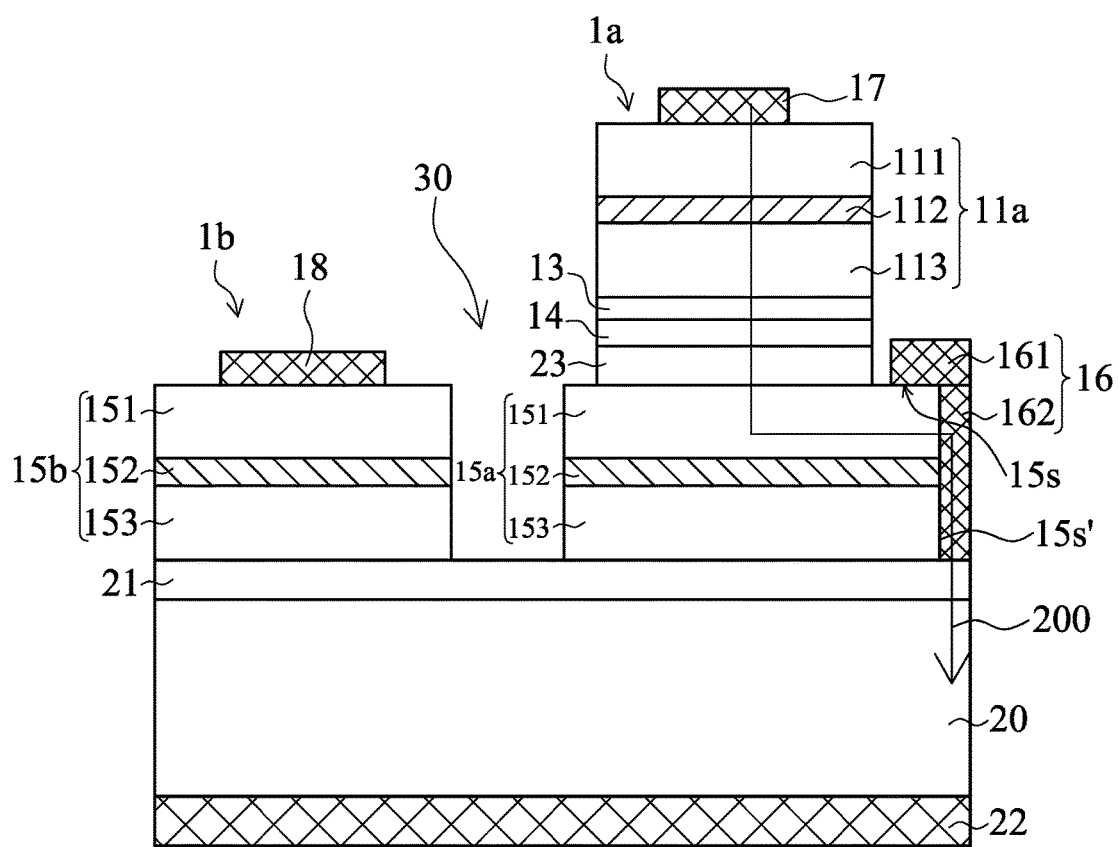
FIG. 3 shows a sectional view of a light-emitting device in accordance with a second embodiment of the present disclosure.

Next, as shown in FIG. 2 or FIG. 3, a bottom electrode 22 is arranged on rear side of the carrier 20 to be electrically connected both to the first semiconductor structure 11a, the second semiconductor structure 15a, and the third semiconductor structure 15b. A first top electrode 17 and a second top electrode 18 are respectively formed on the front side of the first semiconductor structure 11a and the front side of the third semiconductor structure 15b.

Next, alternate examples of the method of manufacturing the light-emitting device 1 are respectively shown in FIG. 2 and FIG. 3.

Please refer to FIG. 2 for a first example of the method of manufacturing the light-emitting device 1. The method further comprises forming a third top electrode 16 on an exposed surface 15s of the second semiconductor structure 15a and applying an electrical current across the third top electrode 16 and the bottom electrode 22 to break down the diode character of the second semiconductor structure 15a. Specifically, a reverse bias is applied across the third top electrode 16 and the bottom electrode 22 to permanently break down the diode character of the second semiconductor structure 15a such that the second active layer 152 of the second semiconductor structure 15a is not capable of emitting light. More specifically, an electrical current ranging from 80 A/cm² to 200 A/cm² is injected into the second semiconductor structure 15a for a duration of time between 0.1 and 0.5 second across the third top electrode 16 and the bottom electrode 22 to break down the diode behavior of the second semiconductor structure 15a. As a result, the second semiconductor structure 15a becomes and function as a resistor having a low resistance lower than 200 ohms, preferably lower than 100 ohms, more preferably lower than 10 ohms, and therefore, the second MQW structure of the second active layer 152 of the second semiconductor structure 15a is substantially non-luminous even when forward-biasing the second semiconductor structure 15a. After finishing all the process steps described above, the light-emitting device 1 of first embodiment of the present disclosure is formed as shown in FIG. 2.

Please refer to FIG. 3 for a second example of the method of manufacturing the light-emitting device 1. The method further comprises forming a third top electrode 16 directly on a top surface 15s and a side surface 15s' of the second semiconductor structure 15a to short-circuit the second semiconductor structure 15a, and therefore, driving current between the first top electrode 17 and the bottom electrode 22 bypasses the second active layer 152 of the second semiconductor structure 15a to make the second active layer 152 of the second semiconductor structure 15a incapable of emitting light during normal operation. After finishing all the process steps described above, the light-emitting device 1 of second embodiment of the present disclosure is formed as shown in FIG. 3.

The first top electrode 17, the second top electrode 18, the bottom electrode 22, and the third top electrode 16 comprise metal material having low electrical resistance, such as Au, Al, Pt, Cr, Ti, Ni, W, or the combination thereof, and can be formed of a monolayer or multiple layers. A thickness of the first top electrode 17, the second top electrode 18, the bottom electrode 22, or the third top electrode 16 is about 0.1 to 10 microns. The first top electrode 17 and the second top electrode 18 each has a shape such as rectangular, polygon, circle, or ellipse from a top view of the light-emitting device 1. The first top electrode 17, the second top electrode 18, the bottom electrode 22, and the third top electrode 16 can be formed by sputtering, vapor deposition, or plating.

FIG. 2 shows a sectional view of the light-emitting device 1 in accordance with the first embodiment of the present disclosure. The light-emitting device 1 comprises a first light-emitting element 1a and a second light-emitting element 1b. The first light-emitting element 1a comprises the first semiconductor structure 11a and the second semiconductor structure 15a, and the second light-emitting element 1b comprises the third semiconductor structure 15b. The first light-emitting element 1a and the second light-emitting element 1b both formed on the carrier 20. The first light-emitting element 1a comprises the first semiconductor structure 11a, and the second semiconductor structure 15a formed between the first semiconductor structure 11a and the carrier 20. The first active layer 112 of the first semiconductor structure 11a of the first light-emitting element 1a comprises a first MQW structure driven by the first top electrode 17 and the bottom electrode 22 to emit light having a first dominant wavelength $\lambda_1$. The second active layer 152 of the second semiconductor structure 15a of the first light-emitting element 1a comprises a second MQW structure does not emit light when the first light-emitting element 1a is driven to emit light having a first dominant wavelength $\lambda_1$. The second light-emitting element 1b comprises a third semiconductor structure 15b formed above the carrier 20 and next to the first light-emitting element 1a, wherein the second active layer 152 of the third semiconductor structure 15b comprises a third MQW structure comprising the same material composition and the same layer sequence as the second MQW structure of the second semiconductor structure 15a, and the third MQW structure is driven by the second top electrode 18 and the bottom electrode 22 to emits light having a second dominant wavelength $\lambda_2$. The first MQW structure of the first semiconductor structure 11a comprises a material or a material composition different from that of the second MQW structure of the second semiconductor structure 15a or the third MQW structure of the third semiconductor structure 15b. The first dominant wavelength $\lambda_1$ is different from the second dominant wavelength $\lambda_2$. In an example of the embodiment, the first dominant wavelength $\lambda_1$ is greater than the second dominant wavelength $\lambda_2$. In another example of the embodiment, the first dominant wavelength $\lambda_1$ is in the infrared range and the second dominant wavelength $\lambda_2$ is in the red range. In another example of the embodiment, the first dominant wavelength $\lambda_1$ and the second dominant wavelength $\lambda_2$ are both in the red range.

The third top electrode 16 is formed on the surface 15s of the second semiconductor structure 15a. The first top electrode 17 and the bottom electrode 22 provide first electrical current to forward bias the first MQW structure of the first active layer 112 of the first semiconductor structure 11a to emit light having a first dominant wavelength $\lambda_1$. The second top electrode 18 and the bottom electrode 22 provide second electrical current to forward bias the third MQW structure of the second active layer 152 of the third semiconductor structure 15b to emit light having a second dominant wavelength $\lambda_2$, wherein $\lambda_1$ is different from $\lambda_2$. More specifically, the first light-emitting element 1a only emit the first dominant wavelength generated in the first MQW structure under an electrical current 100 flowing in series through the first MQW structure and the second MQW structure, wherein the second MQW structure of the second active layer 152 of the second semiconductor structure 15a is non-luminous even when forward-biasing the second semiconductor structure 15a.

FIG. 3 shows a sectional view of a light-emitting device 1 in accordance with the second embodiment of the present disclosure. The elements shown in FIG. 3 denoted by same numbers as the elements shown in FIG. 2 comprises same structure, material and functions, and are not addressed again.

As shown in FIG. 3, the first semiconductor structure 11a and the second semiconductor structure 15a of the first light-emitting element 1a form a stepped shape at a surface 15s of the second semiconductor structure 15a. The third top electrode 16 comprises a contact 161 formed on the top surface 15s of the second semiconductor structure 15a and a bridge 162 coated on a side surface 15s' of the second semiconductor structure 15a. Specifically, the third top electrode 16 abuts the surface of the second semiconductor structure 15a. The contact 161 is arranged on the surface 15s of the second semiconductor structure 15a, and the bridge 162 extends from the contact 161 to the carrier 20 or the adhesive layer 21. The second MQW structure of the second active layer 152 of the second semiconductor structure 15a is short circuited by the third top electrode 16 and disabled from emitting light. The third top electrode 16 comprise metal material having low electrical resistance, such as Au, Al, Pt, Cr, Ti, Ni, W, or the combination thereof, and can be formed of a monolayer or a multiple layers. The third top electrode 16 provides a series electrical connection between the first top electrode 17 and the bottom electrode 22. The third top electrode 16 is directly formed on the top surface and the side surface of the second semiconductor structure 15a to short-circuit the second semiconductor structure 15a, and therefore, driving current between the first top electrode 17 and the bottom electrode 22 bypasses the second active layer 152 of the second semiconductor structure 15a to make the second active layer 152 of the second semiconductor structure 15a incapable of emitting light during normal operation. The first MQW structure of the first active layer 112 of the first semiconductor structure 11a is driven by the first top electrode 17 and the bottom electrode 22 to emit light comprising the first dominant wavelength $\lambda_1$. More specifically, the first light-emitting element 1a only emit the first dominant wavelength $\lambda_1$ generated in the first MQW structure under an electrical current 200 flowing in series through the first MQW structure and the second MQW structure, wherein the second MQW structure is non-luminous.

As shown in FIGS. 2-3, the light emitting device 1 comprises the adhesive layer 21 comprising metal material, such as Cu, Al, Pt, Ti, W, Ag, or the combination thereof. The adhesive layer 21 is formed between the first light-emitting element 1a and the carrier 20, and/or between the second light-emitting element 1b and the carrier 20 to reflect the light generated in the first active layer 112 of the first light-emitting element 1a toward to a light extraction surface of the first light-emitting element 1a distant from the carrier 20, and/or the light generated in the second active layer 152 of the second light-emitting element 1b toward a light extraction surface of the second light-emitting element 1b. In an embodiment of the present disclosure, the light extraction efficiency of the first light-emitting element 1a and the second light-emitting element 1b can be improved the adhesive layer.

Furthermore, the diode character of the second semiconductor structure 15a of the first light-emitting element 1a may not completely be broken down in the first embodiment or the short circuit formed by the third top electrode 16 (contact 161 and bridge 162) may not completely block electrical current flowing through the second active layer 152 of the second semiconductor structure 15a of the first light-emitting element 1a in the second embodiment. Some dim light with weak optical output power may be generated and emitted from the second active layer 152 of the second semiconductor structure 15a of the first light-emitting element 1a. Accordingly, the reflective layer 13 is formed between the first semiconductor layer 151 of the second semiconductor structure 15a of the first light-emitting element 1a and the second semiconductor layer 113 of the first semiconductor structure 11a of the first light-emitting element 1a as shown in FIG. 2 and FIG. 3 to reflect the light generated in the first active layer 112 of the first semiconductor structure 11a of the first light-emitting element 1a toward a light extraction surface of the first semiconductor structure 11a of the first light-emitting element 1a, and reflect the light generated in the second active layer 152 of the second semiconductor structure 15a of the first light-emitting element 1a away from the light extraction surface of the first semiconductor structure 11a of the first light-emitting element 1a. In these cases, the second active layer 152 of the second semiconductor structure 15a of the first light-emitting element 1a emits an optical output power less than 10% of a total optical output power of the light-emitting device 1.

It will be apparent to those having ordinary skill in the art that various modifications and variations can be made in accordance with the present disclosure without departing from the scope or spirit of the disclosure. In view of the foregoing, it is intended that the present disclosure cover modifications and variations of this disclosure provided they fall within the scope of the following claims and their equivalents.

What is claimed is:

1. A light-emitting device, comprising:
a carrier;
a first semiconductor element formed on the carrier and comprising a first semiconductor structure and a second semiconductor structure, wherein the second semiconductor structure is closer to the carrier than the first semiconductor structure is to the carrier, the first semiconductor structure comprises a first multiple quantum well structure configured to emit a first light having a first dominant wavelength during a normal operation, and the second semiconductor structure comprises a second multiple quantum well structure configured not to emit light during the normal operation; and
a tunnel junction formed between the first semiconductor structure and the second semiconductor structure, wherein the tunnel junction comprises a p-n junction.

2. The light-emitting device of claim 1, wherein the first semiconductor structure comprises a first n-type semiconductor layer, a first p-type semiconductor layer, and the first multiple quantum well structure is between the first n-type semiconductor layer and the first p-type semiconductor layer; and the second semiconductor structure comprises a second n-type semiconductor layer, a second p-type semiconductor layer, and the second multiple quantum well structure is between the second n-type semiconductor layer and the second p-type semiconductor layer.

3. The light-emitting device of claim 1, further comprising a first top electrode formed on the first semiconductor structure, a bottom electrode formed on the carrier, and a third top electrode formed on the second semiconductor structure of the first semiconductor element, wherein the third top electrode and the bottom electrode form a main current path bypassing the second multiple quantum well structure during the normal operation.

4. The light-emitting device of claim 3, wherein the third top electrode provides a series electrical connection between the first top electrode and the bottom electrode.

5. The light-emitting device of claim 3, wherein current flows through the first top electrode and the bottom electrode to forward bias the first multiple quantum well structure to emit the first light during the normal operation.

6. The light-emitting device of claim 3, wherein the second multiple quantum well structure is permanently broken down to conduct current between the first top electrode and the bottom electrode during the normal operation.

7. The light-emitting device of claim 1, wherein an electrical current flows in series through the first multiple quantum well structure and the second multiple quantum well structure.

8. The light-emitting device of claim 1, further comprising a second semiconductor element formed on the carrier, wherein the first semiconductor element is physically spaced apart from the second semiconductor element.

9. The light-emitting device of claim 8, wherein the second semiconductor element comprises a third semiconductor structure, the third semiconductor structure comprises a third multiple quantum well structure having the same layer sequence and the same material composition as that of the second multiple quantum well structure of the first semiconductor element.

10. The light-emitting device of claim 9, wherein the first semiconductor element comprises a first top electrode, the second semiconductor element comprises a second top electrode, the first multiple quantum well structure emits the first light by conducting a first driving current between the carrier and the first top electrode, and the third multiple quantum well structure emits a second light having a second dominant wavelength by conducting a second driving current between the carrier and the second top electrode.

11. The light-emitting device of claim 10, wherein the first dominant wavelength is different from the second dominant wavelength.

12. The light-emitting device of claim 10, wherein the first light is infrared light and the second light is red light.

13. The light-emitting device of claim 1, wherein a first well layer in the first MQW structure comprises a composition or a composition ratio different from that of a second well layer in the second multiple quantum well structure.

14. The light-emitting device of claim 13, wherein the first well layer comprises $In_xGa_yAl_{1-x-y}As$ ($0 \leq x, y \leq 1$), the second well layer comprises $In_aGa_bAl_{1-a-b}P$ ($0 \leq a, b \leq 1$).

15. The light-emitting device of claim 1, further comprising an etching stop layer formed between the first semiconductor structure and the second semiconductor structure.

16. The light-emitting device of claim 1, further comprising a distributed bragg reflector formed between the first semiconductor structure and the second semiconductor structure.

17. The light-emitting device of claim 1, wherein the tunnel junction comprises a first layer of a first conductivity-type and a second layer of a second conductivity-type, wherein the first conductivity-type is different from the second conductivity-type.

18. The light-emitting device of claim 17, wherein the first semiconductor element comprises a semiconductor layer having a doping concentration, wherein the first layer of a first conductivity-type and/or the second layer of a second conductivity-type has a doping concentration at least one order higher than the doping concentration of the semiconductor layer of the first semiconductor element.

19. A light-emitting device, comprising:
a carrier; and
a first semiconductor element formed on the carrier and comprising a first semiconductor structure and a second semiconductor structure, wherein the second semiconductor structure is closer to the carrier than the first semiconductor structure is to the carrier, the first semiconductor structure comprises a first multiple quantum well structure configured to emit a first light having a first dominant wavelength during a normal operation, and the second semiconductor structure comprises a second multiple quantum well structure configured not to emit light when forward-biasing the second semiconductor structure, wherein the second semiconductor structure functions as a resistor having a resistance lower than 200 ohms.

20. The light-emitting device of claim 19, further comprising a second semiconductor element formed on the carrier, wherein the first semiconductor element is physically spaced apart from the second semiconductor element.

21. A light-emitting device, comprising:
a carrier;
a first semiconductor element formed on the carrier and comprising a first semiconductor structure and a second semiconductor structure, wherein the second semiconductor structure is closer to the carrier than the first semiconductor structure is to the carrier, the first semiconductor structure comprises a first multiple quantum well structure configured to emit a first light having a first dominant wavelength during a normal operation, and the second semiconductor structure comprises a second multiple quantum well structure configured not to emit light during the normal operation;
a contact on a surface of the second semiconductor structure; and
a bridge on a side surface of the second semiconductor structure,
wherein the second semiconductor structure comprises a third semiconductor layer, a fourth semiconductor layer, and a second active layer between the third semiconductor layer and the fourth semiconductor layer, wherein the bridge extends from the contact and covers a side surface of the third semiconductor layer, a side surface of the fourth semiconductor layer and a side surface of the second active layer.

22. The light-emitting device of claim 21, further comprising an adhesive layer between the second semiconductor structure and the carrier.

23. The light-emitting device of claim 22, further comprising a second semiconductor element on the carrier, wherein the first semiconductor element is physically spaced apart from the second semiconductor element.

* * * * *